US005770857A

United States Patent [19]

Fuerstenau et al.

[11] Patent Number: 5,770,857

[45] Date of Patent: Jun. 23, 1998

[54] APPARATUS AND METHOD OF DETERMINING MOLECULAR WEIGHT OF LARGE MOLECULES

[75] Inventors: Stephen Fuerstenau, Montrose; W. Henry Benner, Danville; Norman Madden, Livermore; William Searles, Fremont, all of Calif.

[73] Assignee: The Regents, University of California, Oakland, Calif.

[21] Appl. No.: 749,837

[22] Filed: Nov. 15, 1996

Related U.S. Application Data

[60] Provisional application No. 60/006,884, Nov. 17, 1995.

[51] Int. Cl.[6] .................... H01J 37/244

[52] U.S. Cl. .................... 250/281; 250/282; 250/283; 250/286; 250/397

[58] Field of Search .................... 250/281, 282, 250/283, 286, 287, 397

[56] References Cited

U.S. PATENT DOCUMENTS

| | | | |
|---|---|---|---|
| 4,357,536 | 11/1982 | Varma et al. | 250/397 |
| 5,475,228 | 12/1995 | Palathingal | 250/397 |
| 5,591,969 | 1/1997 | Park et al. | 250/283 |

*Primary Examiner*—Kiet T. Nguyen
*Attorney, Agent, or Firm*—Pepi Ross; Paul R. Martin

[57] ABSTRACT

A mass spectrometer determines the mass of multiply charged high molecular weight molecules. This spectrometer utilizes an ion detector which is capable of simultaneously measuring the charge z and transit time of a single ion as it passes through the detector. From this transit time, the velocity of the single ion may then be derived, thus providing the mass-to-charge ratio m/z for a single ion which has been accelerated through a known potential. Given z and m/z, the mass m of the single ion can then be calculated. Electrospray ions with masses in excess of 1 MDa and charge numbers greater than 425 $e^-$ are readily detected. The on-axis single ion detection configuration enables a duty cycle of nearly 100% and extends the practical application of electrospray mass spectrometry to the analysis of very large molecules with relatively inexpensive instrumentation.

43 Claims, 9 Drawing Sheets

APPARATUS AND METHOD OF DETERMINING MOLECULAR WEIGHT OF LARGE MOLECULES

This invention was made with U.S. Government support under Contract No. DE-AC03-76SF00098 between the U.S. Department of Energy and the University of California for the operation of Lawrence Berkeley Laboratory. The U.S. Government may have certain rights in this invention. This application claims benefit of provisional application Ser. No. 60/006884 filed Nov. 17, 1995.

FIELD OF THE INVENTION

The present invention pertains to the field of mass spectrometry of large molecules and particles, and more specifically to the use of charge-detection techniques for the simultaneous determination of the charge and mass-to-charge ratio of large molecules and particles, enabling real-time calculation of their masses.

BACKGROUND OF THE INVENTION

Much of the progress in the field of mass spectrometry over the last ten years has been marked by an ever increasing mass range made possible by new ionization techniques. Electrospray ionization (ESI) appears to be unlimited by the size of molecules that can be ionized and macromolecular ions with masses up to 100,000 Daltons (Da) are now analyzed routinely in most mass spectrometers which can be interfaced to an ESI source. Perhaps as important as the ability of ESI to generate high mass molecular ions in the gas phase without fragmentation is its ability to create multiply charged ions. These ions have mass-to-charge ratios (m/z) values sufficiently low to allow their analysis in instruments with mass ranges normally limited to a couple of thousand Daltons for singly charged ions. In interpreting results of pioneering molecular beam experiments with ESI of 400,000 Da polystyrene molecules, it was concluded that such massive ES ions carried, at most, the charge of only five electrons. Later, when ESI was combined with a mass spectrometer it was discovered that polyethylene oxide molecules, as well as other macromolecules such as proteins, could hold many more charges (on average about one charge per 1000 Da). ES mass spectra of polymer ions with molecular weights as high as 5 MDa and as many as 5000 charges were later recorded. The actual molecular weights of the ions in the ESI-MS spectra could not be determined because the mass analyzers used lacked the resolution to identify a series of adjacent peaks corresponding to consecutive charge states. Such experiments were further complicated by the distribution of molecular weights in most polymer samples. The extent of multiple charging, therefore, effectively limited practical mass analysis with ESI to about 100,000 Da, and much less for polymer distributions. However, the mass of protein complexes with molecular weights as large as 1.3 MDa have recently been determined by using an ESI time-of-flight instrument which enabled them to make measurements at relatively high values of m/z.

A break-through in the analysis of high molecular weight compounds by ESI-MS was made using a Fourier transform ion cyclotron resonance (FTICR) mass spectrometer to trap single ions of megadalton DNA. Individual electrospray ions of a few million Daltons molecular weight carried enough charge to be detected and isolated in the trapping cell of that instrument. Single ions were trapped long enough to observe shifts in their charge states caused by reaction with background gas molecules, and demonstrated that the resulting set of adjacent m/z "peaks" could be deconvoluted to yield the ion mass with high accuracy for ions with molecular weights up to $1\times10^7$ Da. It was not possible to determine m by deconvoluting the spectra from a large number of trapped ions, in part, because it was not certain that several adjacent charge states of a single ion species were represented in the initial cloud of trapped ions. As an alternative to the charge state shift method, the mass of individual ions was determined by measuring their charge directly along with a value for each ion's m/z. Using this approach it was possible to "weigh" individual ions of DNA with molecular weights as high as $1\times10^8$ Da with more than 35,000 charges. The system was sensitive enough to detect a single ion with only 30 charges. At present, the FTICR-MS is able to determine the charge on an ion with a precision of only ±10% regardless of the absolute charge. This error, resulting from uncertainties in the ion orbit, leads to a proportionate error in the mass determination.

The complexity and cost of the hardware required for FTICR mass spectrometry offers practical limitations to the widespread use of the technique for such applications as sizing megadalton DNA. In addition, the data from FTICR-MS of massive electrospray ions is not in the form of a true mass spectrum because the ions are analyzed one at a time. Data representative of the spectrum of masses in a sample is desirable, but collecting it requires considerable time by the present FTICR-MS methodology.

SUMMARY OF THE INVENTION

The present invention applies the relatively simple technique of time-of-flight mass spectrometry (TOFMS) to the study of massive ES ions by detecting and quantifying the amount of charge (z) on these ions individually. This measure of z, together with a value of m/z, allows a calculation of m for each ion. This method of mass determination may be referred to as charge detection mass spectrometry (CD-MS). Unlike FTICR-MS, which uses an antenna to sense the periodic signal induced by a cloud of nearby trapped ions, the present invention employs a more efficient Faraday cage charge detector through which the ions pass. The ions are accelerated from a known electrostatic potential and are directed to fly through the center of a tube-shaped pick-up electrode onto which an image charge equal in magnitude and opposite in sign to that of the ion charge z is induced. By differentiating the image charge signal, entrance and exit pulses from the passage of each ion through the pick-up tube provide a measure of the ion velocity which, in turn, allows calculation of an m/z for each ion. Given these simultaneous measurements of z and m/z, we can assign a mass (m) to each ion which passes through the pick-up tube.

Mass measurement of ions by simultaneous charge and velocity detection dates back over 30 years to the work of experimenters who were interested in charging and sizing solid particles (iron microspheres) for cosmic dust experiments, and who charged iron microspheres in vacuum electro-statically and detected particles with as few as $10^4$ charges. Later the system was applied for sizing electrospray droplets. Similar mass measurements of electrospray droplets were made using a quadrupole mass filter in conjunction with a charge-sensitive pulse amplifier attached to a Faraday cup, with the electrosprays generated in vacuum. More recently, as part of simulations of micrometeoroid impacts, a particle mass spectrometer was developed with improved charge measurement sensitivity to enable weighing particles with as few as 1500 charges. All of the above experimentation involved particles or droplets having no well-defined masses, as distinguished from studies involving macromolecules having well-defined molecular weights. Ions formed when molecules or solid particles are suspended in a solution which is subjected to electrospray atomization (referred to henceforth as 'electrospray ions') are very different from charged droplets of electrospray solvent. The two above mentioned charge studies involving electrosprays do not therefore represent prior combinations of CD-MS using Faraday tubes or Faraday cups with electrospray ionization as it relates to the utility of this invention.

The CD-MS systems for measuring particles and droplets mentioned so far did not demonstrate the sensitivity of charge detection believed necessary for analyzing electrospray ions of megadalton DNA. Two recent investigations suggested that it might be possible to perform in flight charge detection with more precision than had been done previously. A metal cylinder electrode was used to measure charges as small as $5\times10^{-17}$ C (z=300) on individual aerosol particles. In a recently reported experiment, the detection of the charge from packets, believed to be as few as a hundred singly charged, laser desorbed ions in a TOF spectrometer, were measured by means of a charge sensing grid.

The above difficulties in measurement of the masses of large molecules and particles are at least partially solved with the application of a mass spectrometer system including a detector comprising an electrical charge-sensing tube through which charged particles or molecular ions travel unhindered. Special mounting structures and electromagnetic shields are used to minimize electronic noise in the detector. Associated low-noise charge-sensitive electronic amplifiers communicate particle transit time and charge information to a data system. In the current configuration, the time at which a particle arrives and exits the tube is determined. The energy of the ions can be modulated, which alters the velocity of the ions and leads to a determination of the ion mass-to-charge ratio m/z. Simultaneously, the electrical charge z on the particle is measured.

In one embodiment, the charge-sensitive detector is utilized in a mass spectrometer employing an electrospray ionization process in which ions are generated at atmospheric pressure and a small fraction of these ions are drawn through a controlled leak into a high vacuum chamber. These ions are aimed to enter the tube of the detector. The measurement of transit time and charge of many individual ions passing through the tube leads to data related to the mass of the ion or particle.

In another embodiment, the charge-sensitive detector is used in combination with other detectors. For example, the time at which an ion enters the detector tube serves as a start signal for timing the travel of the ion through a long flight path. The arrival of the ion at the end of the flight is determined with another detector, such as a second charge-sensitive detector or a microchannel plate.

In yet another embodiment, electrospray ions are directed to pass through two or more charge sensing tubes to improve the precision of both timing and charge determination. An alternative embodiment involves the use of a charge sensing tube or tubes in conjunction with a charge sensing plate or Faraday cup to make additional measurement of the ion charge. In these embodiments of the invention a time of flight method is used to determine the mass to charge ratio of the ions. In the most general case, embodiments of the invention involve alternative mass spectrometric methods for determination of individual electrospray ion mass to charge ratios in conjunction with charge sensing Faraday tubes or Faraday cups for quantifying the charge on individual ions. These alternative mass spectrometric techniques are based on methods which include, but would not be limited to, magnetic sectors, Wien filters, quadrupole ion filters and quadrupole ion traps, and pulsed extraction time of flight instruments.

The unifying feature of these embodiments is that charge detection mass spectrometry is performed on electrospray ions by combining information about mass to charge ratio, obtained by some mass spectrometric means, with a quantification of the charge of individual ions obtained by passing those ions through a charge sensing Faraday cage tube or by collecting them on a charge sensing Faraday cup.

In an additional embodiment, the present invention is utilized with ionization processes other than electrospray which produce highly charged high mass ions or particles.

In summary, electrospray ionization, as opposed to other ion sources used in mass spectrometry, is unique in its ability to produce highly charged ions from thermally labile, nonvolatile molecules of biological interest. However, if the average charge state of the electrospray ions is more than 100–200 unit charges, the molecular weight of these ions cannot be determined by traditional beam mass spectrometric methods which make measurements on an aggregate population of ions. Such measurements make charge state determination impossible. When ions possesses very high charge states individual ions may be detected in a manner that allows direct determination of their charge state. One method of charge detection has been applied to individual electrospray ions inside the trapping cell of an FTICR mass spectrometer. That approach is impractical for a number of reasons. The present invention is based on another charge detection methodology which uses a Faraday cage pick-up tube. The invention represents the first instance of the combination of this charge detection methodology with electrospray ionization to yield mass information on individual ions. The combination of electrospray ionization with this charge detection method of determining molecular weight is novel and permits unique measurement capability.

BRIEF DESCRIPTION OF THE DRAWINGS

Referring to the drawings.

DESCRIPTION OF THE PREFERRED EMBODIMENT

Figure 1:
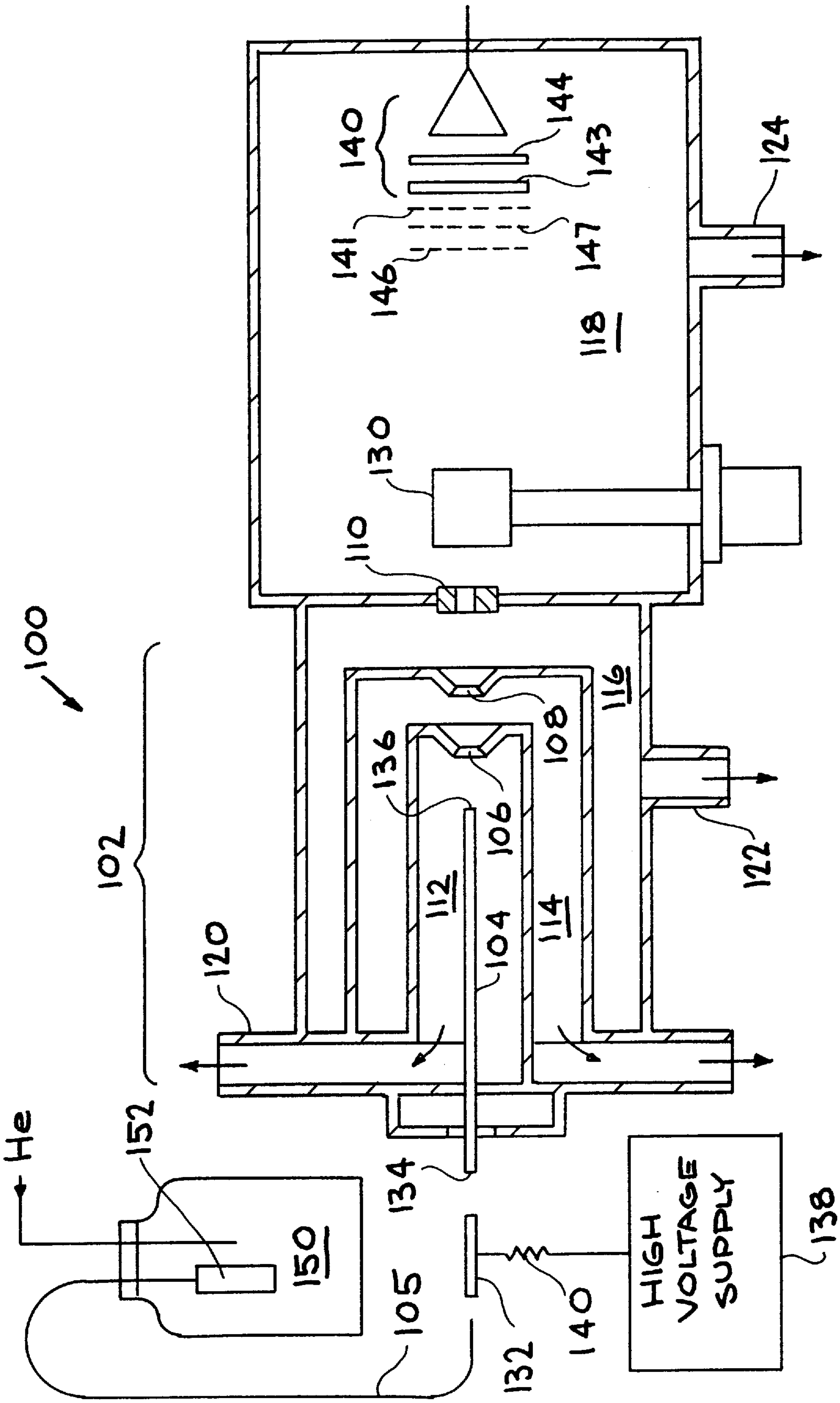
FIG. 1 is a diagram of a mass spectrometer system showing one embodiment of the present invention.

Referring specifically to FIG. 1, a mass spectrometer system 100 embodying the present invention is illustrated in a cross-sectional view. In this specific embodiment, an electrospray source 102 is shown, comprising a glass capillary 104, two skimmers 106 and 108, and an orifice plate 110. Elements 104, 106, 108 and 110 serve to define four vacuum stages 112, 114, 116 and 118, respectively.

The electrospray needle 132 is held 1 to 3 cm away from the inlet 134 to the vacuum system, formed by the inlet 134 to the glass capillary 104, typically 18 cm long with a 0.5 mm bore diameter. The exterior of the capillary 104 is coated with metal at the inlet end 134 and outlet end 136 to help establish potentials for electrostatic focusing.

The inlet end 134 of the capillary is shrouded with a sheath gas (not shown) flowing counter-current to the direction of ion drift. The sheath gas is typically $N_2$, heated to about 70° C. which promotes evaporation of the electrospray droplets and suppresses corona discharge at the electrospray needle 132 which is biased by a high voltage supply 138 through a resistor 140. The outlet of the capillary 136 rests 4.0 mm from the first conical skimmer 106. The second conical skimmer 108 is separated from the first skimmer 106 by 15.0 mm. The opening in the first skimmer 106 is 0.8 mm in diameter and that in the second skimmer 108 is 1.0 mm in diameter. The first skimmer 106 acts as a barrier between the first 112 and second 114 vacuum stages which are evacuated by one or more mechanical pumps (not shown) through pumpout port 120 to background pressures of 1 to 2 torr and 80 to 150 millitorr, respectively. The third vacuum stage 116 is evacuated by a diffusion pump (not shown) through pumpout port 122 to below $1\times10^{-3}$ torr. The fourth vacuum stage 118 is pumped by a turbopump (not shown) through a third pumpout port 124 to $1.0\times10^{-6}$ torr.

A short einzel lens (not shown) is positioned in the 20.0 mm space between the second skimmer 108 and the orifice plate 110. The orifice plate 110 is 1.0 mm thick with a 3.0 mm hole. The metal-coated outlet 136 of the glass capillary 104 and the skimmers 106 and 108 act as electrodes in electrostatic focusing lenses, with potentials as high as 330 V. The orifice plate 110 is usually held at ground potential (0 V). Ions are accelerated to a kinetic energy whose value is roughly the average of the electrostatic potentials on the two skimmers 106 and 108. Alternatively, the orifice plate 110 can be floated so that ions are accelerated primarily in the fourth vacuum stage 118 where they experience fewer collisions with the background gas. Floating the orifice plate 110 however, produces a lower ion transmission.

The source 102 can be tuned to select massive ions while rejecting lighter ones by setting the capillary outlet 136 voltage below that of the first skimmer 106 by 10 to 20 V. Such selectivity is confirmed by the correlated response of the micro-channel plate ion detector 140, which responds to all ions, with the response of the charge detector 130, which only registers the highly charged massive ions.

Figure 2:
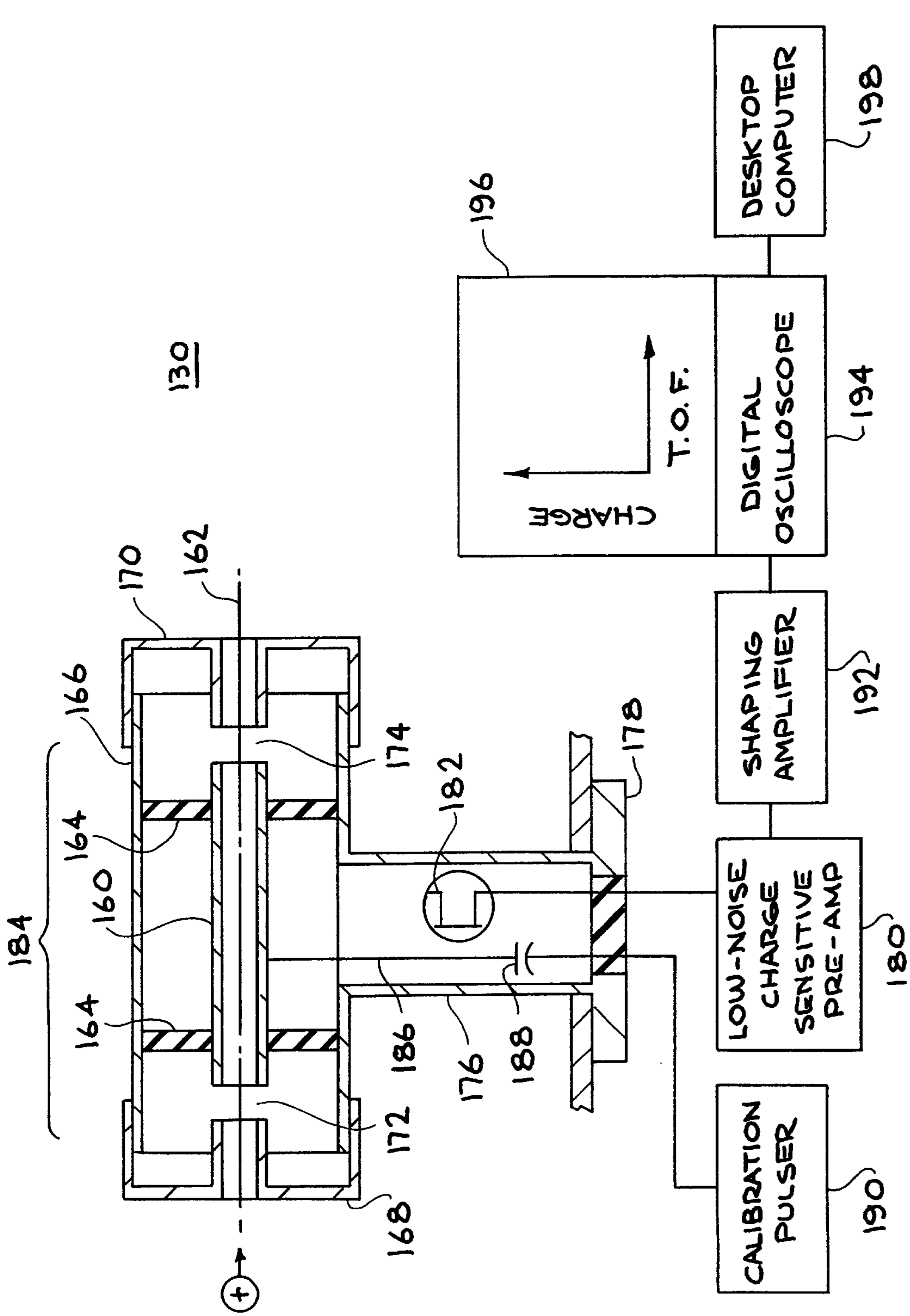
FIG. 2 is a side view of the charge detector in cross-section and the signal detection, amplification, display, and storage set-up.

The charge detector assembly 130 is illustrated in FIG. 2. It comprises a tube made of an electrical conductor. In some cases a plate may be used instead of a tube. A thin-wall brass tube 160 was used in one experiment. It is sometimes referred to as a "charge pick-up tube" because a charge image is induced in it by the ion for which the mass is measured. This charge image is further analysed by electronic circuitry to reveal the mass of the ion. For a particular charge value and velocity of the ion to be measured, the tube length must be long enough to capture the image charge. Additionally the tube diameter must be large enough to intersect and capture a measurable portion of the ion beam. Typically the tube diameter is between about 1 mm and 20 mm. More preferably the tube diameter is between about 4 mm and about 8 mm. Typically the tube length is between about 1 mm and about 400 mm. More preferably the tube length is between about 4 mm and about 160 mm. The tube used in one experiment was 3.5 cm long and had a 6.35 mm bore. The bore of the pick-up tube 160 is coaxially aligned with the ion beam axis 162 allowing a fraction of the ions in the beam to pass through the detector 130 unhindered.

The pick-up tube 160 is supported with polyethylene insulators 164 inside a metal shield 166 approximately 3 cm in diameter and 5 cm long. The insulators may however be made of any mechanically sturdy electrically insulating material. The hollow end caps 168 and 170 of the shield 166 are movable along the pickup tube axis permitting adjustment of the gaps 172 and 174 between the end caps 168 and 170 and the pick-up tube 160. Adjusting these gaps 172 and 174 will change the rise time of induced pulses. Typically the gaps are adjusted to between a) a distance just wide enough to prevent electrical conduction between the pick-up tube and shield and b) a distance about equal to the inside diameter (or minimum cross-distance, if cross section is not circular) of the tube. More preferably the gaps are adjusted to between about 1 mm and about 4 mm. Most commonly the gaps were adjusted to between about 0.5 mm and about 1.0 mm. Smaller gaps result in faster rise times for the charge image signal. AS the m/z decreases, the rise time increases. Thus the pick-up tube and rf shield assembly is tunable for the mass to charge ratio of the ion being detected. The outer shield 166 is mounted firmly on a hollow metal post 176 which, in turn, is fastened to an electrically isolated vacuum flange 178 equipped with electrical feedthroughs (not shown). The outer shield used in one experiment had a 2.5 cm O.D.

The signal induced on the pick-up tube 160 is amplified by a low-noise charge-sensitive preamplifier 180. In some cases a pick-up plate is used instead of a pick-up tube. As an ion enters the pick-up tube 160, it induces an image charge on the pick-up tube 160 which is proportional in magnitude to the ion charge and of the same sign as the ion charge. The pick-up tube 160 is maintained at a virtual ground (approximately 0 V) because it is connected to the input of a low-noise, high-gain negative-feedback amplifier. The front end of the feedback amplifier comprises a junction field effect transistor (JFET). A simple FET can also be used but will exhibit more noise. The combination of the pick-up tube 160, the supporting insulators 164, the outer shield 166 and the end caps 168 and 170 comprises the tube/shield assembly 184. The tube/shield assembly 184 is designed to possess a minimum capacitance in order to maximize the voltage presented to the input element of a low-noise high-gain negative feedback amplifier [JFET transistor (2N4416) 182 in the illustrated embodiment] by a small charge. The capacitance is also minimized because thermally generated noise measured at the output of the preamplifier 180 is directly proportional to the total capacitance at the JFET transistor 182 gate. In one experimental set-up the tube/shield assembly 184 and electrical lead 186, along with a feedback capacitor and resistor (not shown) and a 0.3 pf test capacitor 188, had a total capacitance of 4–5 pf, which was matched by the capacitance of the JFET transistor 182 input. The test capacitor value is chosen to have 10% or less of the capacitance of the JFET, and tube/shield assembly. The test capacitor 188 allows a known amount of charge to be pulsed onto the pick-up tube 160 for calibration purposes. The test pulses were generated with a shaping pulse generator 190 so that the time dependent signal response can be determined as well. A commercial pulse generator made by HP (model 8005B) was used in one reduction to practice of the invention. The ion mass is only determined to the same level of accuracy to which the capacitance of the test capacitor known. For example, if it is desired to measure the mass of the ion to within 1% of its mass, then the capacitance of the test capacitor must be known within 1% of its true value.

The low noise JFET 182 acts as the remote input stage to a preamplifier 180. The JFET is positioned far enough away from the tube that stray capacitance is not added to the tube by the presence of the JFET and close enough to the tube that stray noise is not picked up on the electrical lead between the JFET and the tube. The output of the preamplifier is differentiated and integrated by a second pulse shaping amplifier 192. The low-noise charge-sensitive preamplifier 180 was built at the Lawrence Berkeley Laboratory, operated by the University of California for the Department of Energy, and circuit diagrams are available there under the title, "LBL General Purpose Large Dynamic Range Preamplifier model #21X9101S-5", incorporated herein by reference. The shaping amplifier 192 was also built at the Lawrence Berkeley Laboratory. It's circuit design is based on standard nuclear pulse shaping amplifiers and is available from the laboratory under the title, "Shaping Amplifier Deign #21X-1011P-1", incorporated herein by reference. For the preamplifier front end, FETs from many sources will work. It was found that a JFET performed well and that performance increased when the capacitance of the FET or JFET matched the capacitance of the tube/shield assembly plus the capacitance of the electrical lead. The resulting output for each ion is then fed to a digital oscilloscope 194 for display of the charge v. time 196. The type of oscilloscope to use will be obvious to a person of skill in the art. For example, a Le Croy model 90350 digital oscilloscope was used in one test embodiment.

Figure 3:
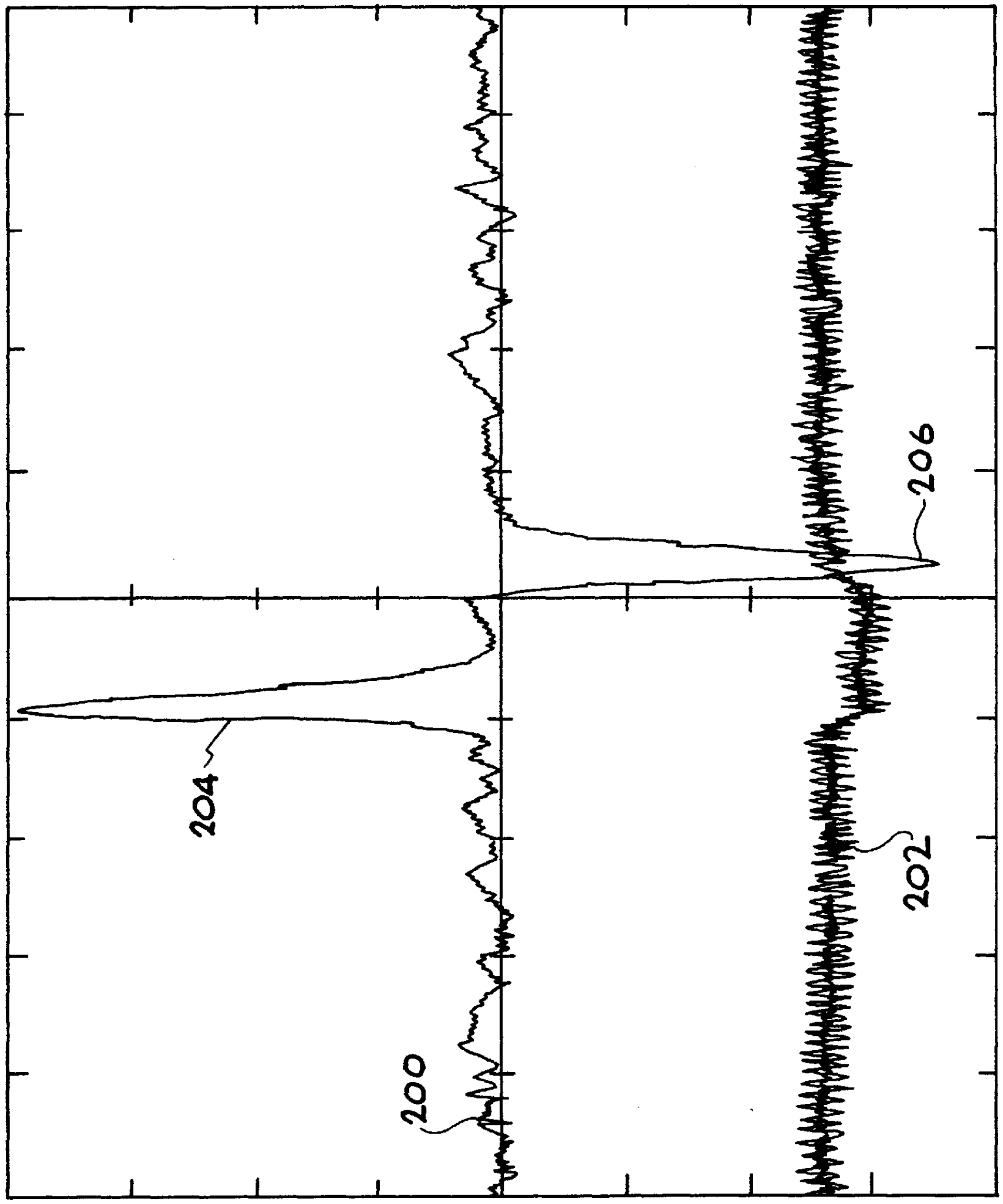
FIG. 3 shows oscilloscope traces of the signal developed by the charge-sensitive detector and amplifier set-up in FIG. 2 arising from the transit of a single DNA ion through the charge detector tube.

A double pulse signal is typified by that shown in the top oscilloscope trace 200 of FIG. 3 for a single 6.4 MDa DNA ion, where the (horizontal) time scale is 10 μs/div. The upper trace 200 (100 mV/div) is the electronic derivative of the charge v. time trace 202 (2 mV/div) at the bottom of FIG. 3. The leading positive amplitude pulse 204 corresponds to the image charge induced by the ion entering the pick-up tube 160 and the second negative amplitude pulse 206 results as the ion exits from the pick-up tube 160. The time between the two pulses 204 and 206 corresponds approximately to the flight time required for the ion to traverse the length of the pick-up tube 160.

The shaping amplifier 192 improves the signal-to-noise ratio through pulse shaping filters. The peaking time of the amplifier is the time required for the signal to rise from the baseline to the peak of the pseudo-Gaussian pulse. Pulse shape filters reduce much of the higher frequency "series" noise associated with the channel of the preamplifier input JFET, as well as low frequency parallel noise sources. With a peaking time of 3.2 μs, the detector system 130 exhibits a minimum noise level of 50 electrons r.m.s. If the rise time of the actual signal is a significant fraction or longer than the peaking time, the measured pulse amplitude will be reduced. Pulse amplitude reduction can be accounted for in the assignment of a charge value, if the rise time of the induced pulse is known. The passage of an ion is captured by a digital oscilloscope 194 which not only records the entire charge v. time waveform 202 for each passing ion, but also the derivative waveform 200. In addition, the digital oscilloscope 194 also calculates the time between the leading 204 and trailing 206 pulses and the amplitudes of the two pulses 204 and 206. The waveforms 200 and 202 are transferred to a desktop computer 198 where they are used to compute the charge and the mass of each ion. Because the beam does not require modulation or chopping to provide timing information, the duty cycle of the mass spectrometer system 100 is virtually 100%. The transmission efficiency of the electrospray ion source 102, however, is quite low. The fraction of the total number of sample molecules ionized in the electrospray region reaching the analyzer stage of our instrument could be at most $10^{-4}$.

The mass-to-charge ratio of an ion is determined by time-of-flight techniques using ion velocity and acceleration voltage so that:

$$m/q=2\ V/v_m^2 \qquad \text{(eq. 1)}$$

where m is the mass, q is the ion charge, V is the electrostatic acceleration voltage, and $v_m$ is the measured ion velocity. A correction needs to be made to take into account the initial kinetic energy imparted to the ion by the free jet expansion of the gas prior to acceleration by the electric field. The ion's final kinetic energy is the sum of its initial kinetic energy and the electrostatic potential energy set by the skimmer lenses 106 and 108. It follows that the mass of an ion is given by:

$$m=2\ q\ V/(v_m^2-v_g^2) \qquad \text{(eq. 2)}$$

where the ion velocity due to the gas expansion, $v_g$, is determined by grounding all electrodes 134, 136, 106, 108, and 110 and timing the passage of the ion through the detector 130. The value of $v_g$ is usually about 10% that of $v_m$ for ions of DNA in the 10,000 m/z range when V is set to 300 volts. Because $v_m^2 >> v_g^2$, uncertainties in $v_g$ lead to a minimal error in the determination of m. This is less true for larger m/z ions. For example, 315 nm polystyrene latex microspheres nebulized from solution by electrospray ionization and having masses around $10^{10}$ Da, increase their velocity by only 10% over $v_g$ when accelerated through 300 V.

Some of the ions which fly through the charge detector 130 strike a micro-channel plate detector 140 (MCP) positioned 40.0 cm behind the exit of the charge pick-up tube 160. A grounded grid 141 lies directly in front of the MCP detector 140 to ensure that the ions are not accelerated by the −2 kV potential on the first MCP 143 until they are close to the entrance of the first MCP 143. The MCP detector 140 will respond to ions below a maximum mass-to-charge m/z ratio which depends on the kinetic energy of the ion beam. The micro-channel plates 143 and 144 are not sensitive to the amount of charge on the detected ions. Massive DNA ions with m/z values up to 20,000 and an energy of at least 2000 eV/charge create pulses in the MCP detector 140. The MCP detector 140 is used to determine the arrival time and flux of the detected ions.

An improved estimate for the ion velocity may be made by timing the flight of an ion over the 40 cm between the charge detector 130 and the MCP detector 140 instead of just the 3.5 cm length of the pick-up tube 160. By timing the ion's passage over a longer flight path, the precision of the velocity estimate should improve ten fold.

All of the mass spectra shown in FIGS. 4–6 and 9 were recorded in experiments with ions generated from positively charged electrosprays. Samples were pumped through a one meter length of 50 $\mu$m I.D. silica capillary 105 at flow rates from 0.01 to 1.0 $\mu$L/min, depending on the solution conductivity. The fine bore capillary 105 helps stabilize the electrospray at low flow rates. The flow is regulated, by adjusting the pressure of a helium atmosphere 150 above the sample reservoir 152.

Figure 4A:
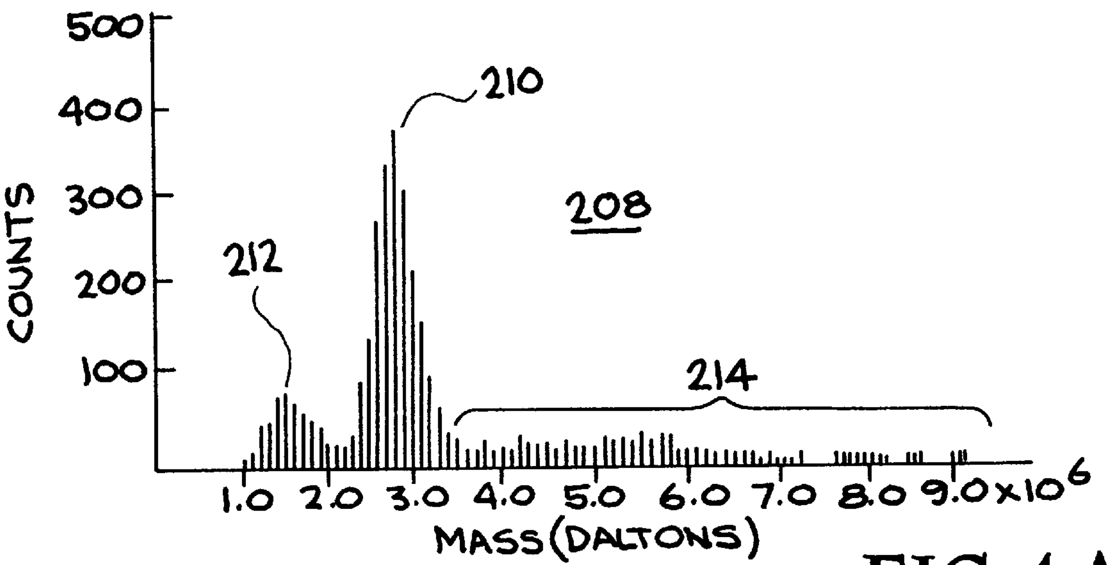
FIG. 4*a* shows a mass spectrum for 2.8 MDa pBR322 DNA ions showing evidence for single-stranded and double-stranded molecular ions, as measured with the mass spectrometer system in FIG. 1.
Figure 4B:
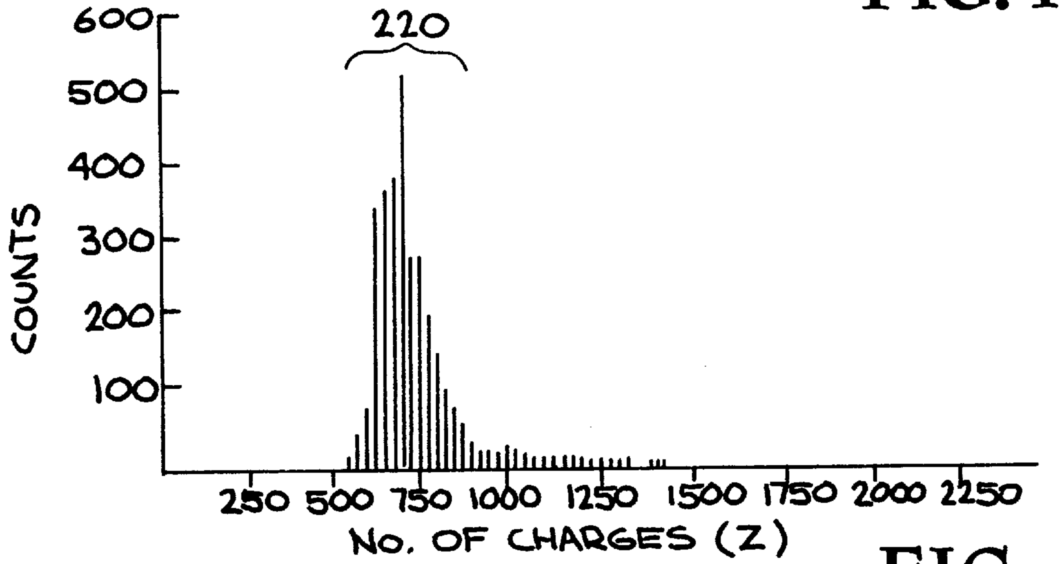
FIG. 4*b* shows the associated positive charge distribution corresponding to the mass spectrum in FIG. 4*a;*
Figure 4C:
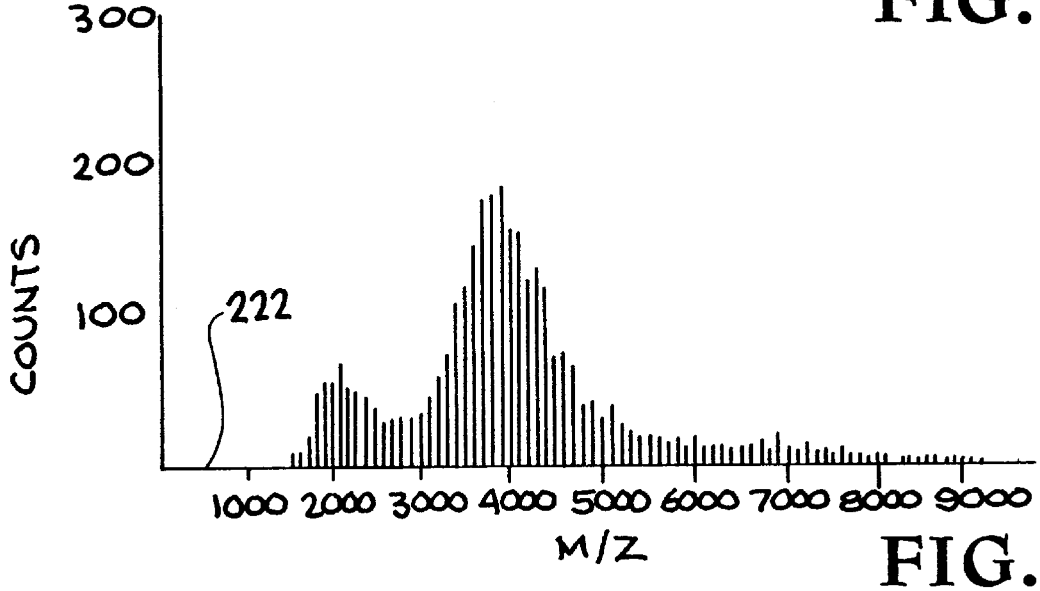
FIG. 4*c* shows the associated m/z distribution corresponding to the mass spectrum in FIG. 4*a;*

FIG. 4*a* shows a mass spectrum of 2.8 MDa DNA (pBR322) in a histogram format 208, representing the measurement of about 3000 individual ions sampled during a period of 20 minutes. Ions of the double stranded molecule are represented by the taller peak 210 of the histogram 208 with a centroid at approximately 2.8 MDa ($\sigma$=200,000 Da). The smaller peak 212, whose centroid falls at roughly half the mass of the taller peak 210, corresponds to single stranded molecules. The small ion populations at higher mass 214 (greater than 3 MDa) may represent dimers of the single- and double-strands or molecules contaminated with solvent or other adducts. The distribution of charge for the ions in this experiment is histogrammed in FIG. 4*b*. Note that the charge distribution 220 is narrow (20% FWHM) in comparison with the range in mass, with most of the ions possessing between 600 and 800 charges. The m/z values presented in FIG. 4*c* range from 1500 to 3000. The distribution of charge states was restricted at the lower end 222 by the threshold limit of charge detection set by the trigger level on the oscilloscope. The threshold is typically set at a level which corresponds to a charge of around 250 electrons.

Figure 5:
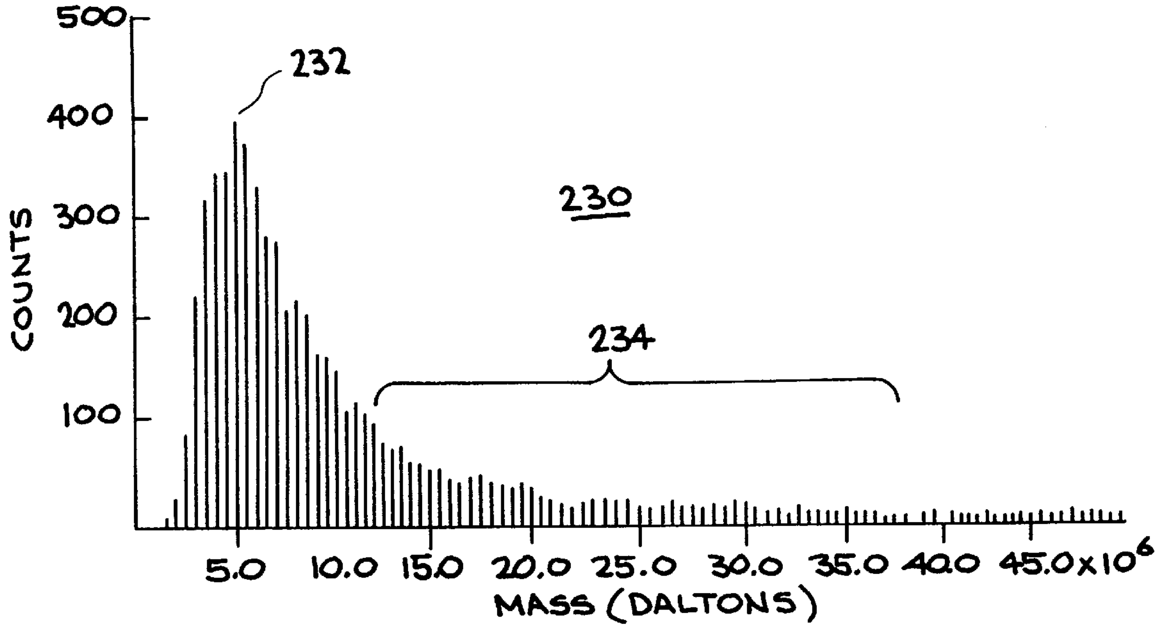
FIG. 5 is a mass spectrum of polyethylene oxide, with a nominal MW=7 MDa, as measured using the mass spectrometer system in FIG. 1.

FIG. 5 shows the mass spectrum 230 from a suspension of polyethylene-oxide (PEG) with a nominal average MW=7 MDa. The mass distribution of the polymer exhibits a maximum 232 at 5 MDa as well as a high mass tail 234.

Figure 6:
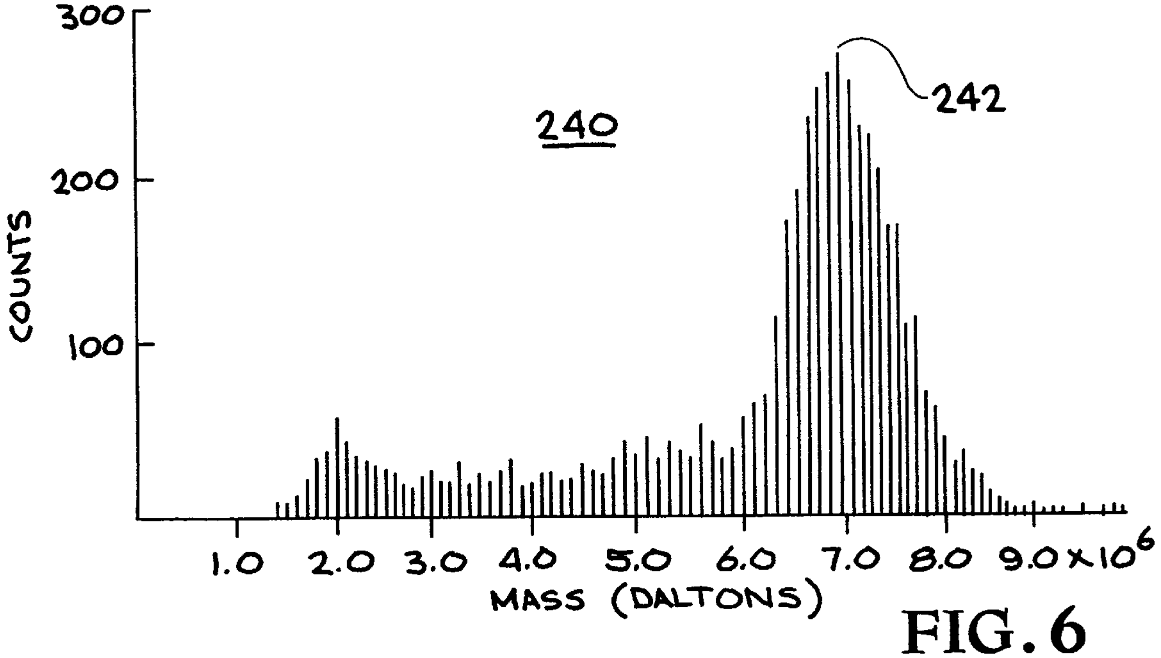
FIG. 6 is a mass spectrum of electrospray molecular ions of Col El plasmid DNA with a MW=7.3 MDa, derived from over 3000 single ion measurements recorded over a 20 minute period with the mass spectrometer system in FIG. 1.

FIG. 6 is a mass spectrum 240 of Col El Amp Plasmid DNA, MW=7.3 MDa. The main peak 242 shown is centered around 6.9 MDa, somewhat smaller than the expected value, probably due to a slight underestimation of the flight time of the ions.

Figure 7:
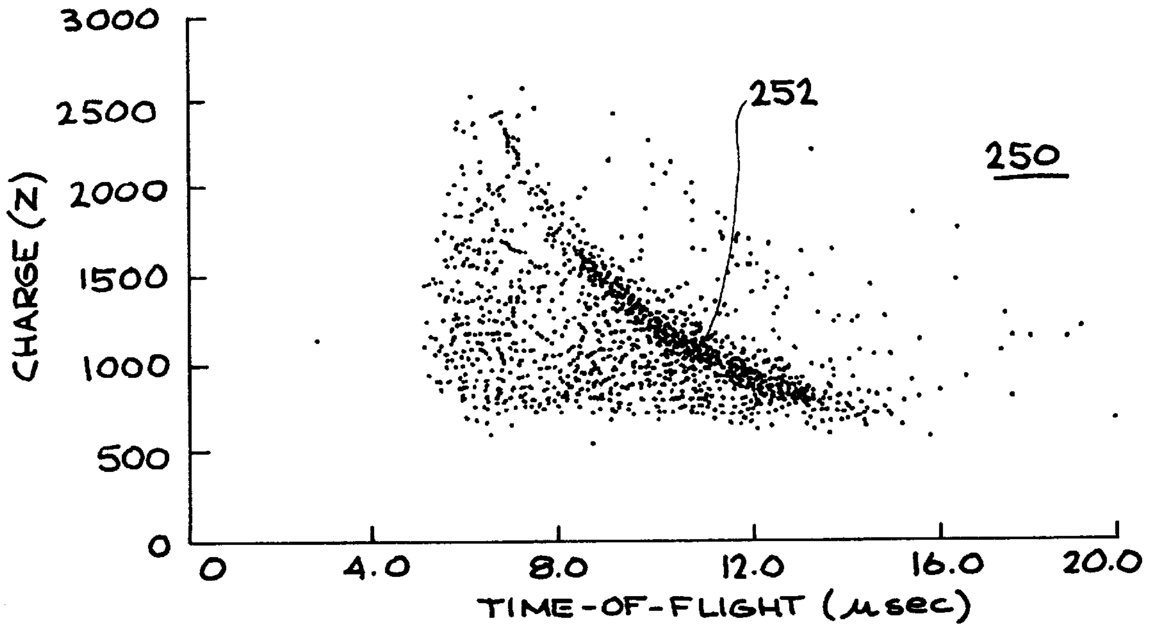
FIG. 7 displays raw data used to derive the mass spectrum in FIG. 6.

The raw data used in the calculation of the mass spectrum in FIG. 6 are plotted in the 2-D graph 250 displayed in FIG. 7. Each point in the scatter plot represents data for a single ion. The mass of an ion should be roughly proportional to the ratio of the charge divided by the square of the ion velocity as shown in Eq. 1. Accordingly, ions possessing the same mass but different charge should lie along a curve relating flight time to charge. Such a relationship is represented by the crescent shaped cluster 252 of ions at the center of the plot 250.

Figure 8:
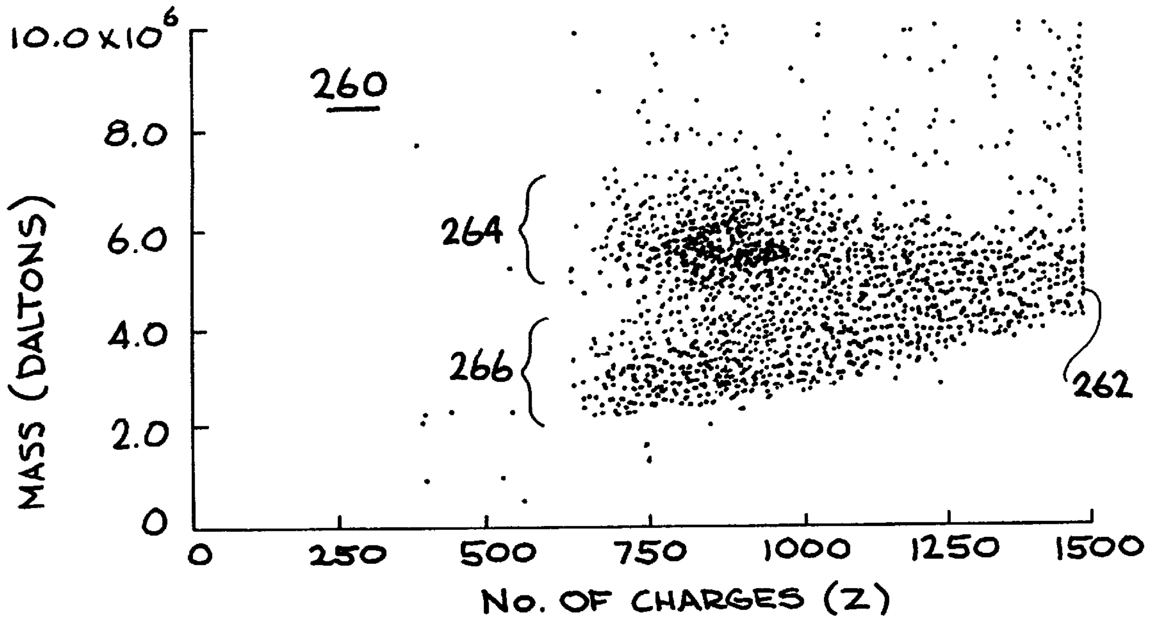
FIG. 8 displays a graph of calculated molecular mass v. the total molecular ion charge.

FIG. 8 presents a scatter plot 260 relating mass and charge, where the data was collected from a sample of pMSG-Cat DNA (MW=5.5 MDa). The two data clusters 264 and 266 probably represent single- and double-stranded DNA molecules. The sharp transition 262 at the right edge of the scatter plot 260 is due to ions with charge signals greater than the maximum amplitude range set on the oscilloscope during data acquisition. The two clusters 264 and 266 of data show opposite trends with the higher mass ion cluster 264 exhibiting a slightly decreasing charge with increasing mass. This plot illustrates the unique type of data that CD-MS can provide: a characterization of the charge storage capability of the ions being analyzed as a function of their masses, in addition to the standard data on the ion mass distribution.

Figure 9A:
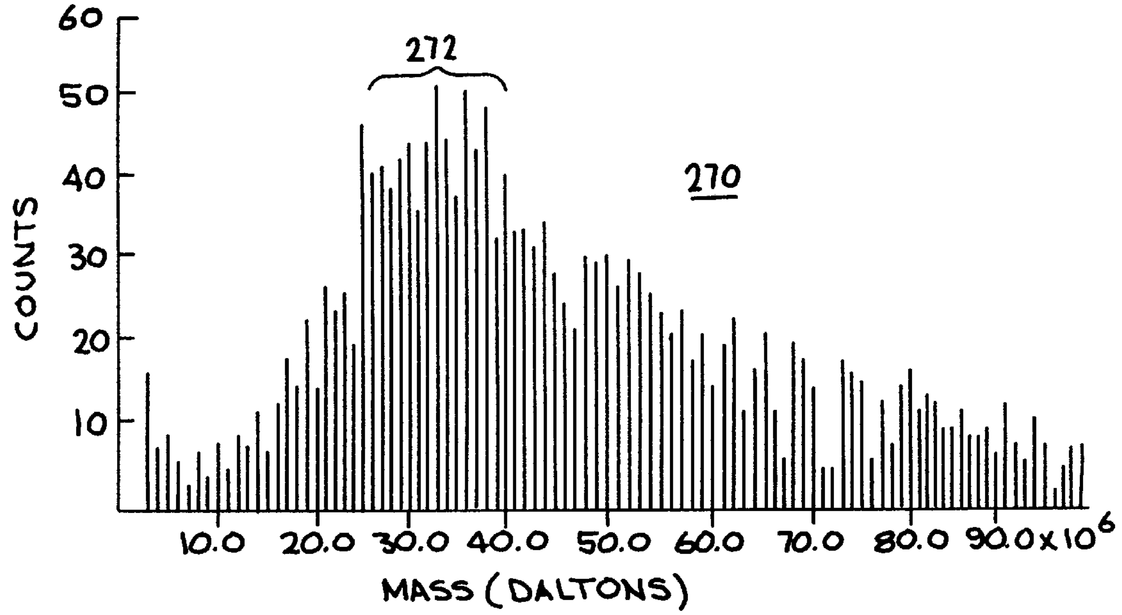
FIG. 9*a* shows a mass spectrum from Lambda Phage DNA, with MW=31.5 MDa, showing a broad mass distribution despite a high charge state, as measured with the mass spectrometer system in FIG. 1.

FIG. 9*a* exhibits a mass spectrum 270 of Lambda Phage DNA (MW=31.5 MDa). The peak 272 in the histogram is broader than expected considering that these ions hold two to three times the average charge of smaller DNA ions, possibly due to ion fragmentation in the ion source 102. In general, the precision of CD-MS should improve with more highly charged ions because the fractional uncertainty in the charge measurement decreases.

Figure 9B:
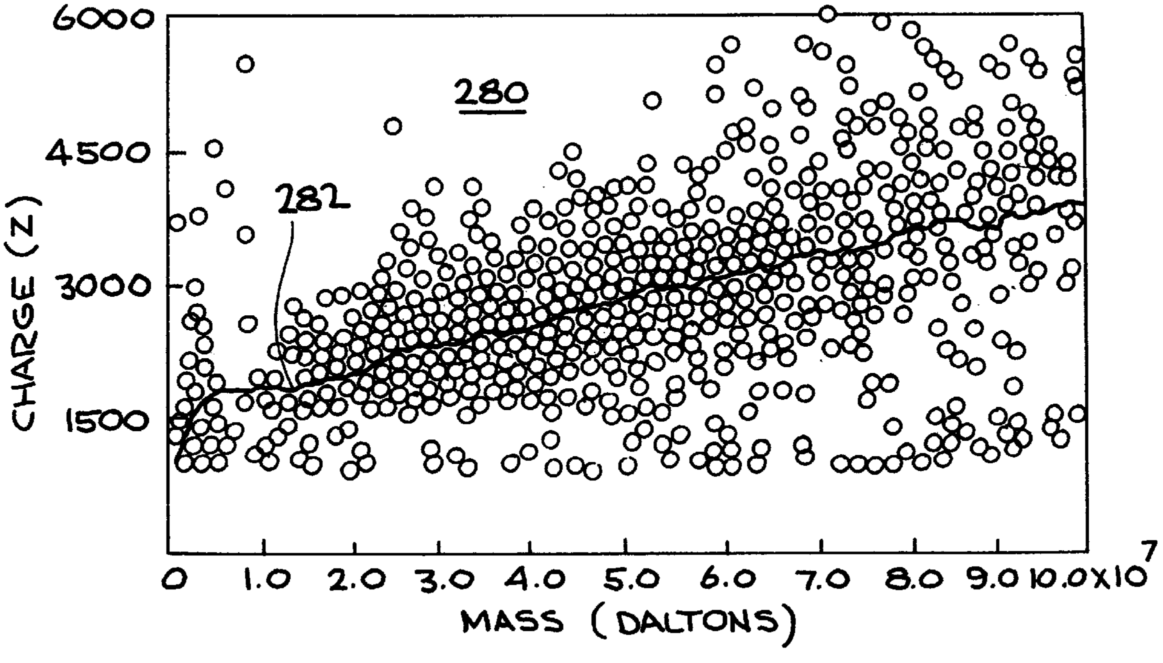
FIG. 9*b* is a 100-point moving average graph of charge v. mass showing a linear trend suggestive of elongated gas phase ions.

FIG. 9*b* is a scatter plot 280 of the data from FIG. 9*a* along with a 100 point moving average of the charge v. mass. The fact that the charge per unit mass appears to be constant, as indicated by the general linear relationship 282 between charge and mass, suggests that the massive DNA ions are more linear or extended, and not compact, or "balled up," in their configuration. This conclusion is based on the fact that the charge per mass of a large electrospray ion should be proportional to the ratio of the ion's surface area to its volume. For molecules with a linear geometry, this ratio remains constant as m increases.

Figure 10:
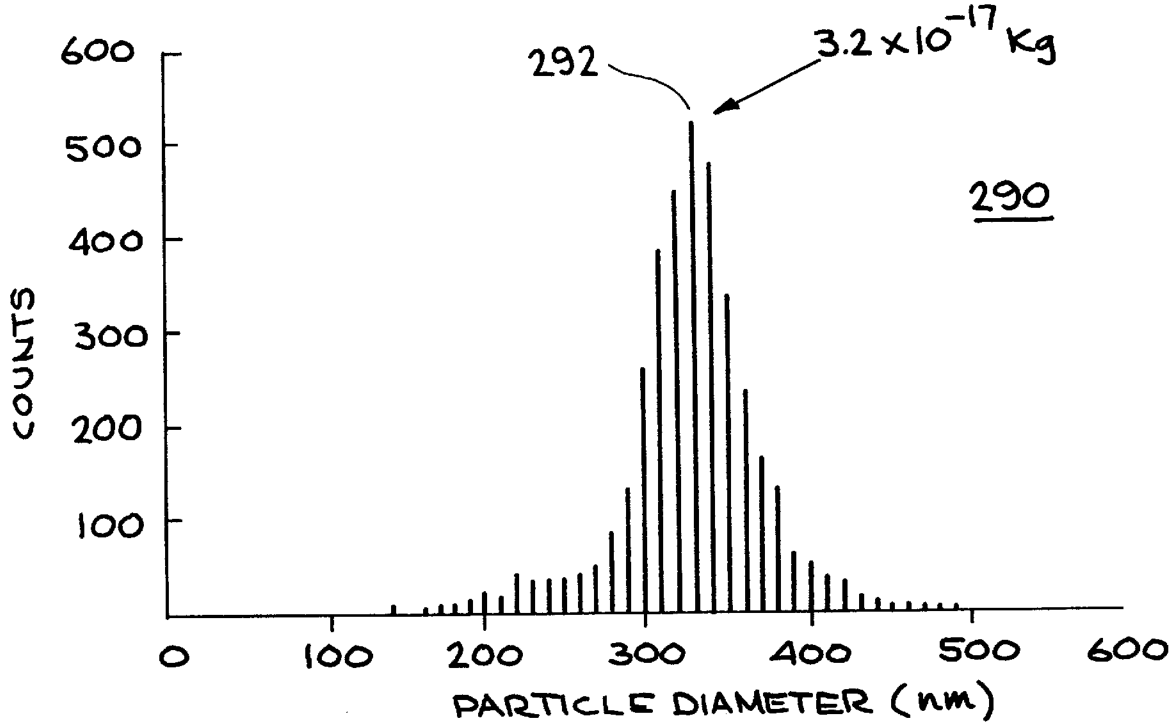
FIG. 10 shows a measured size distribution of polystyrene spheres obtained by charge detection mass spectrometry.

FIG. 10 is a size distribution histogram 290 based on a CD-MS analysis of polystyrene latex microspheres with a nominal mean diameter of 314 nm ($\sigma$=16 nm) and a specific gravity of 1.05. The measured size distribution for these particles was centered 292 around 319 nm. If these particles were molecules their molecular weight would be $10^{10}$ Da. The mean charge on the particles was $5\times10^{-16}$ C, or approximately 2600 unit charges. These ions thus have m/z=$10^{10}$/2600=$3.8\times10^{7}$. Ions with high m/z (>$10^{5}$) are not greatly accelerated by the 300 volt potential in our ion source. When m/z is on the order of $10^{7}$, the ion velocity after electrostatic acceleration may only increase by a factor of 10% over $v_g$. In this regime, accurate determination of $v_g$, the velocity imparted to the ion by the gas jet alone, becomes critical. The mass analysis of particles such as these demonstrates that electrospray is capable of ionizing molecules and particles over a size range encompassing many orders of magnitude. These findings suggest that major portions of chromosomes might be sized with CD-MS. A 300 nm particle is equivalent to $1.3\times10^{7}$ bp or about 30% of the smallest human chromosome.

Figure 11:
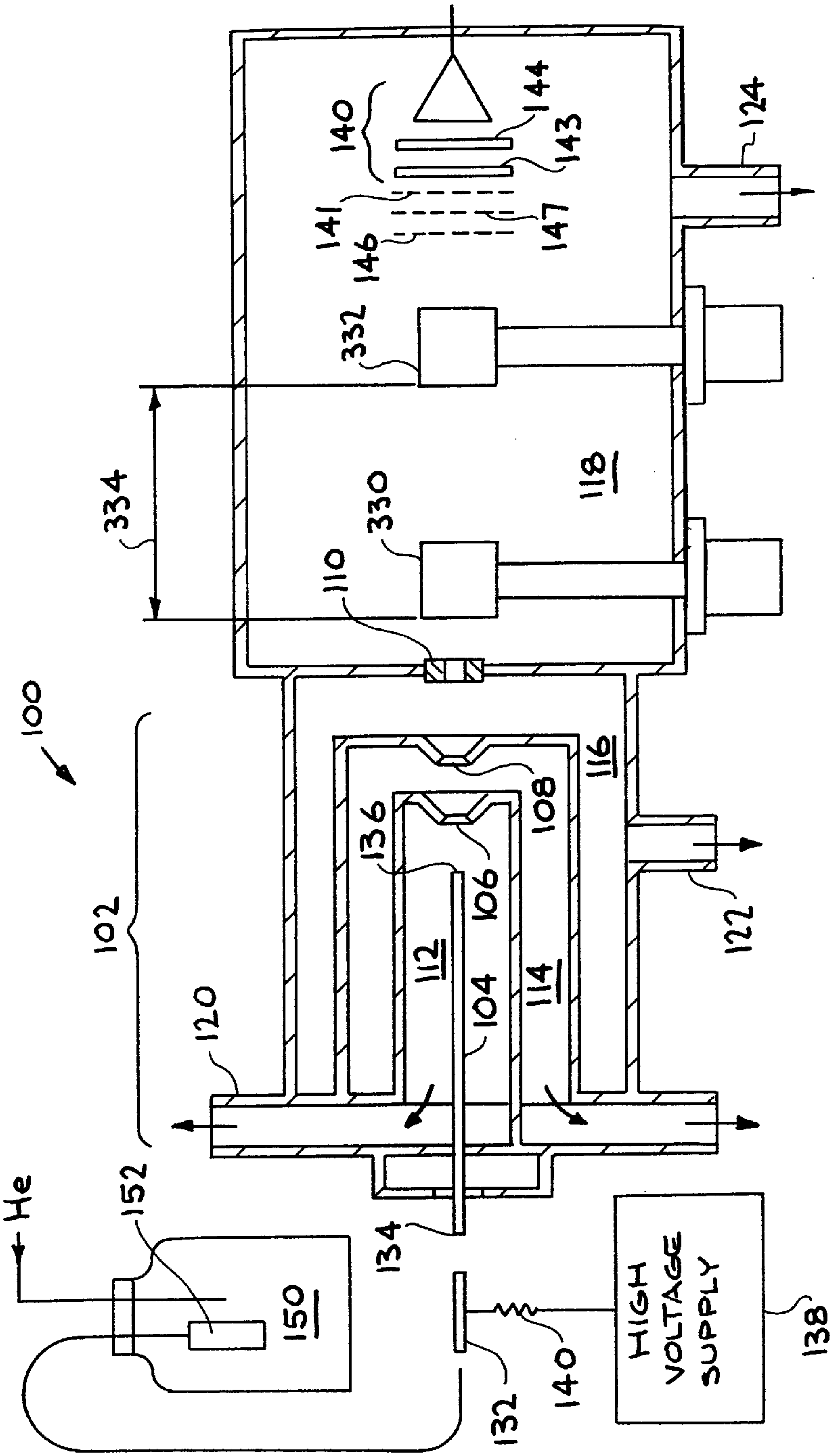
FIG. 11 shows a second embodiment of the present invention, utilizing two charge-sensitive detectors to improve the accuracy of time-of-flight measurement.

FIG. 11 illustrates a second embodiment of the present invention where two identical charge detectors 330 and 332 are spaced a known distance 334 apart. The use of two identical charge detectors 330 and 332, each identical to charge detector 130, are employed to reduce an additional error source arising in the first embodiment when ion velocity is determined by timing the passage of the ion through a single charge detector 130. This error arises from the fact that for an ion passing through a single pick-up tube the time between the "entrance" and "exit" pulses does not necessarily correspond to the time required by the ion to traverse the actual length of the pick-up tube 160. Calculations for a point charge passing through a conducting cylinder predict that the induced image charge will be 95% of the point charge (with opposite sign) after penetrating 5.0 mm past the entrance plane, or slightly less than one diameter of the pick-up tube 160. Therefore, the image charge signal (such as oscilloscope trace 202) will not have reached the maximum value when the ion is at the pick-up tube 160 entrance plane. An alternative procedure is to treat the "effective" length of the pick-up tube 160 as a calibration parameter to be determined by the time between the pulses. This calibration problem is circumvented in the second embodiment when the ion passes through two identical charge-sensitive detectors 330 and 332 since the time between pulse pairs will correspond exactly to the spacing 334 between the two detectors, regardless of the pulse shape.

Instrument Resolution and Error Sources

An error analysis of Eq. 2 which relates the ion mass to the charge q, flight time t, and electrostatic potential V, yields the simple result that the instrument resolution, R=M/ΔM, is related to uncertainties in charge and flight time in the following manner:

$$R_q = q/\Delta q \text{ and } R_t = (t/2\Delta t)\{1-(v_g/v_m)^2\}$$

where $R_q$ and $R_t$ are the components of the overall resolution associated with charge and time measurement respectively. The overall resolution is given by $$R = (R_t^{-2} + R_q^{-2})^{-1/2}.$$

When $v_g << v_m$, as is usually the case, $R_t$ becomes t/2Δt, which is a commonly used definition of resolution in TOFMS. Most amplified pulses induced by passing DNA ions have a 5–15 ms flight time and an amplitude of 90 to 350 mV. The r.m.s. noise level on the detector is typically about 50 electrons. The timing jitter caused by the noise in the charge measurement ranges from 50 to 500 ns depending on the signal processing method used. One method finds the time interval between the trigger from the first peak and the time of the 50% rise of the trailing peak. The resulting value for t is strongly dependent on the amplitude of the peaks. Constant fraction discrimination is one method which can be applied to improve timing measurements from peak arrivals.

The time of flight technique employed in the above description is advantageous for two reasons. First, it provides a high duty cycle by allowing measurement of all ions in the beam that do not pass through the tube coincidently. Second it permits detection and, in principle, mass determination, of highly charged ions regardless of their mass to charge ratio. This unrestricted m/z range is limited by the practical high voltage limitations in the ion acceleration region of the time of flight device.

The above description of the preferred embodiment, including the exemplary dimensions, in no way limits the scope of the present invention which is identified by the following claims.

What is claimed is:

1. A mass spectrometer system for detecting the mass of large molecules comprising:

a) an electrospray ion source that generates an ion beam;

b) an electrically conducting tube having two ends, the tube located in the ion beam path and having a long axis parallel to the flight path of ions in the ion beam;

c) an rf shield comprising an electrical conductor surrounding the tube and having a movable conducting end cap on each end, the caps having openings at their centers, the shield additionally having an opening for an electrical connection inside a support structure;

d) a circuit to calibrate an electrical image charge signal; and e) an FET located inside the support structure and electrically connected to the tube, the electrical connection located centrally within the shield opening at the support.

2. The mass spectrometer system of claim 1 wherein the FET is located far enough away from the tube that stray capacitance is not added to the tube, close enough to the tube that stray noise is not picked up on the electrical lead to the tube.

3. The mass spectrometer system of claim 1 wherein the tube is long enough to capture the image charge signal and the tube diameter is large enough to intersect and capture a measurable portion of the ion beam.

4. The mass spectrometer system as claimed in claim 3 wherein said system further includes an outer conducting shield and wherein said tube is insulatedly mounted to said outer conducting shield.

5. The mass spectrometer system as claimed in claim 4 further including an end cap mounted on each end of said outer conducting shield.

6. The mass spectrometer system as claimed in claim 5 wherein said end caps are adjustable in an axial direction in order to control any gaps between said end caps and the ends of said tube.

7. The mass spectrometer system as claimed in claim 1 wherein said circuit comprises a test capacitor with a precisely-known capacitance and a shaping pulse generator.

8. The mass spectrometer system as claimed in claim 1 wherein the FET comprises a JFET transistor operated as a high-gain negative feedback amplifier.

9. The mass spectrometer system as claimed in claim 8 further including a signal shaping means for shaping an output signal of said amplifier to improve the signal-to-noise ratio.

10. The mass spectrometer system as claimed in claim 9 wherein said signal shaping means comprises a bandpass filter circuit.

11. The mass spectrometer system as claimed in claim 9 and further including means for recording and displaying the output signal of said signal shaping means.

12. The mass spectrometer system as claimed in claim 11 wherein said means for recording and displaying said output signal is a digital oscilloscope.

13. A mass spectrometer system for detecting large molecules comprising:

(a) an ion source for generating a beam along an axis of multiply-charged high molecular weight ions;

(b) a charge-sensitive ion detector having a pick-up tube;

(c) a charge source permanently coupled to said pick-up tube for introducing a known charge into said charge-sensitive ion detector; and (d) a low-noise charge-sensitive preamplifier having an input stage coupled to the output of said pick-up tube.

14. The mass spectrometer system as claimed in claim 13 wherein said ion source is an electrospray ion source.

15. The mass spectrometer system as claimed in claim 13 wherein said charge-sensitive ion detector contains a cylindrical pick-up tube, having a bore coaxially aligned with the axis of said ion beam.

16. The mass spectrometer system as claimed in claim 14 wherein said system further includes an outer conducting shield wherein said pick-up tube is insulatedly mounted to said outer conducting shield.

17. The mass spectrometer system as claimed in claim 15 further including an end cap mounted on each end of an outer conducting shield and wherein the end cap is adjustable in the axial direction in order to control a gap between the end cap and each end of said pick-up tube.

18. The mass spectrometer system as claimed in claim 13 wherein said charge source comprises a test capacitor with a precisely-known capacitance and a shaping pulse generator.

19. The mass spectrometer system as claimed in claim 13 wherein said input stage comprises a JFET transistor operated as a high-gain negative feedback amplifier.

20. The mass spectrometer system as claimed in claim 13 further including a signal shaping means for shaping an output signal of said preamplifier to improve the signal-to-noise ratio.

21. The mass spectrometer system as claimed in claim 20 wherein said signal shaping means comprises a bandpass filter circuit.

22. The mass spectrometer system as claimed in claim 20 further including means for recording and displaying the output signal of said signal shaping means.

23. The mass spectrometer system as claimed in claim 22 wherein said means for recording and displaying said output signal is a digital oscilloscope.

24. A mass spectrometer system for detecting large molecules comprising:

(a) an electrospray ion source for generating a beam along an axis of multiply-charged high molecular weight ions;

(b) a charge-sensitive ion detector containing a cylindrical pick-up tube, wherein a bore of said pick-up tube is coaxially aligned with the axis of said ion beam, and further including an outer conducting shield, wherein said pick-up tube is insulatedly mounted to said outer conducting shield;

(c) a charge source permanently coupled to said pick-up tube for introducing a known charge into said charge-sensitive ion detector; and (d) a low-noise charge-sensitive preamplifier having an input stage coupled to an output of said pick-up tube.

25. The mass spectrometer system as claimed in claim 24 further including an end cap mounted on each end of said outer conducting shield, and wherein axial positions of said end caps are adjustable in order to control gaps between said end caps and the ends of said pick-up tube.

26. The mass spectrometer system as claimed in claim 24 wherein said charge source comprises a test capacitor with a precisely-known capacitance and a shaping pulse generator.

27. The mass spectrometer system as claimed in claim 24 wherein said input stage comprises a JFET transistor operated as a high-gain negative feedback amplifier.

28. The mass spectrometer system as claimed in claim 24 further including a signal shaping means for shaping an output signal of said preamplifier to improve the signal-to-noise ratio.

29. The mass spectrometer system as claimed in claim 28 wherein said signal shaping means comprises a bandpass filter circuit.

30. The mass spectrometer system as claimed in claim 28 further including means for recording and displaying an output signal of said signal shaping means.

31. The mass spectrometer system as claimed in claim 30 wherein said means for recording and displaying said output signal is a digital oscilloscope.

32. A mass spectrometer system for detecting large molecules and comprising:

(a) an electrospray ion source for generating a beam of multiply-charged high molecular weight ions;

(b) a charge-sensitive ion detector containing a cylindrical pick-up tube, having a bore is coaxially aligned with the axis of said ion beam, and further including an outer conducting shield, wherein said pick-up tube is insulatedly mounted to said outer conducting shield;

(c) a charge source permanently coupled to said pick-up tube for introducing a known charge into said charge-sensitive ion detector; and (d) a low-noise charge-sensitive preamplifier having an input stage comprising a JFET transistor operated as a high-gain negative feedback amplifier coupled to output of said pick-up tube.

33. The mass spectrometer system as claimed in claim 32 further including an end cap mounted on each end of said outer conducting shield, and wherein said end caps are adjustable in an axial direction in order to control any gaps between said end caps and the ends of said pick-up tube.

34. The mass spectrometer system as claimed in claim 32 wherein said charge source comprises a test capacitor with a precisely-known capacitance and a shaping pulse generator.

35. The mass spectrometer system as claimed in claim 32 further including a signal shaping means for shaping an output signal of said preamplifier to improve the signal-to-noise ratio.

36. The mass spectrometer system as claimed in claim 35 wherein said signal shaping means comprises a bandpass filter circuit.

37. The mass spectrometer system as claimed in claim 35 further including means for recording and displaying an output signal of said signal shaping means.

38. The mass spectrometer system as claimed in claim 37 wherein said means for recording and displaying said output signal is a digital oscilloscope.

39. A mass spectrometer system for detecting large molecules and comprising:

(a) an electrospray ion source for generating a beam of multiply-charged high molecular weight ions;

(b) a charge-sensitive ion detector containing a cylindrical pick-up tube having a bore is coaxially aligned with the axis of said ion beam, and further including an outer conducting shield, wherein said pick-up tube is insulatedly mounted to said outer conducting shield;

(c) a charge source permanently coupled to said pick-up tube for introducing a known charge into said charge-sensitive ion detector;

(d) a low-noise charge-sensitive preamplifier having an input stage comprising a JFET transistor operated as a high-gain negative feedback amplifier coupled to an output of said pick-up tube;

(e) a bandpass filter circuit for shaping an output signal of said preamplifier to improve the signal-to-noise ratio; and (f) a digital oscilloscope for recording and displaying an output signal of said bandpass filter circuit.

40. A method of analyzing the mass of large molecules utilizing a mass spectrometer system, comprising the steps of:

(a) generating a beam of multiply-charged high molecular weight ions using an electrospray ion source;

(b) detecting single ions in said ion beam using a charge-sensitive ion detector having a pick-up tube;

(c) providing a charge source for introducing a known charge into said charge-sensitive ion detector; and (d) coupling to an output of said pick-up tube a low-noise charge-sensitive preamplifier having an input stage comprising a JFET transistor operated as a high-gain negative feedback amplifier.

41. The method of analyzing the mass of large molecules utilizing a mass spectrometer system as claimed in claim 40 further including the step of shaping an output of said preamplifier with a bandpass filter circuit to improve the signal-to-noise ratio.

42. A method of analyzing the mass of large molecules utilizing a mass spectrometer system as claimed in claim 41 further including the step of recording and displaying an output signal of said bandpass filter circuit with a digital oscilloscope.

43. A mass spectrometer system for detecting large molecules comprising:

a) an ion source for generating a beam of multiply-charged high molecular weight ions;

b) a charge sensitive ion detector having a pick-up plate;

c) a charge source permanently coupled to said pick-up plate for introducing a known charge-sensitive ion detector; and d) a low-noise charge-sensitive preamplifier having an input stage coupled to the output of said pick-up plate.

* * * * *